United States Patent [19]

Tani et al.

[11] 4,400,716
[45] Aug. 23, 1983

[54] SEMICONDUCTOR DEVICE WITH GLASS LAYER CONTACTING OUTER PERIPHERY OF GUARD RING AND ADJACENT SUBSTRATE

[75] Inventors: Keizo Tani, Yokohama; Makoto Hideshima, Kawasaki, both of Japan

[73] Assignee: Tokyo Shibaura Denki Kabushiki Kaisha, Kawasaki, Japan

[21] Appl. No.: 220,159

[22] Filed: Dec. 23, 1980

[30] Foreign Application Priority Data

Jan. 17, 1980 [JP] Japan ................................. 55-3052

[51] Int. Cl.³ ............................................. H01L 29/34
[52] U.S. Cl. ........................................ 357/54; 357/52; 357/73
[58] Field of Search ............................. 357/52, 54, 73

[56] References Cited

U.S. PATENT DOCUMENTS 3,643,136 2/1972 Tuft ............................................. 357/73
3,760,242 9/1973 Duffy et al. ................................ 357/73

FOREIGN PATENT DOCUMENTS 54-154285 12/1979 Japan ...................................... 357/55

OTHER PUBLICATIONS

J. White, "Structure Capable of Withstanding High Reverse Energy," RCA Tech. Notes, #1239, May 5, 1980.

Primary Examiner—Joseph E. Clawson, Jr.
Attorney, Agent, or Firm—Cushman, Darby & Cushman

[57] ABSTRACT

A semiconductor device with a planar p-n junction and a guard ring region, wherein an oxide film is covered on the surface between the p-n junction and the guard ring, and a glass film is formed on the surface surrounding the guard ring region.

8 Claims, 3 Drawing Figures

SEMICONDUCTOR DEVICE WITH GLASS LAYER CONTACTING OUTER PERIPHERY OF GUARD RING AND ADJACENT SUBSTRATE

BACKGROUND OF THE INVENTION

This invention relates to a semiconductor device with an improved surface protecting structure.

A planar type semiconductor device operable at a high voltages is widely used in many kinds of the electric products. It is well known that the maximation operation voltage of a planar type semiconductor device is influenced by the condition of the surface where the p-n junction is exposed and the neighborhood thereof. A mesa shaped semiconductor device has a high operating voltage, more than the planar type under the same doping conditions, but the mesa shaped device is difficult to manufacture. Therefore, some attempts have been made to increase the operating voltage of the planar type device including guard ring structures which extend the area of a depletion region produced by applying a reverse bias voltage to the p-n junction. The electric field at the surface is divided and depresses the inner portion of the p-n junction.

Glass passivation is also effective as a surface protecting method. The glass passivation film covers the exposed portion of the p-n junction and the outer surface including the guard ring region surrounding the p-n junction. Conventional planar type transistors having a high operating voltage have used the glass passivation film on the surface region which extends from the base junction to the area which surrounds the guard ring region, but this structure has some defects. One is the glass film is damaged by cracking and breaking during manufacture because the glass film of the above-mentioned conventional device has a large area. Glass is easily broken so that the probability of damages is high. The glass has a different coefficient of thermal expansion from the semiconductor substrate so that damage results.

Another concern is low current gain. The active area of the transistor is narrow in consequence of the need to form the guard ring region beside the active area. In addition, the glass film formed on the base p-n junction degrades the accuracy of fine photo engraving process. Because the glass film is thicker than 10 microns, the resolution decreases near the edge of the glass film. Therefore, the emitter region has to keep apart more then 100 microns from the edge of the glass film. The exact photo engraving process does not accomplish and the actual operable area of the transistor is too narrow.

OBJECTS AND SUMMARY OF THE INVENTION

An object of this invention is to provide an improved planar type semiconductor device having a guard ring region and surface protecting films.

Another object of this invention is to provide an improved surface protecting film using a glass passivation film and an oxide film on a planar type semiconductor device.

A further object of this invention is to provide an improved planar type transistor.

The semiconductor device according to this invention comprises a semiconductor substrate having first conductivity type, a first region having second conductivity type, and a ring region having second conductivity type surrounding the first region. An oxide film covers a surface of the semiconductor substrate between the first region and the ring region. A glass film covers the surface of the semiconductor substrate outside of the ring region.

DETAILED DESCRIPTION OF THE PREFERRED EMBODIMENTS

Figure 1:
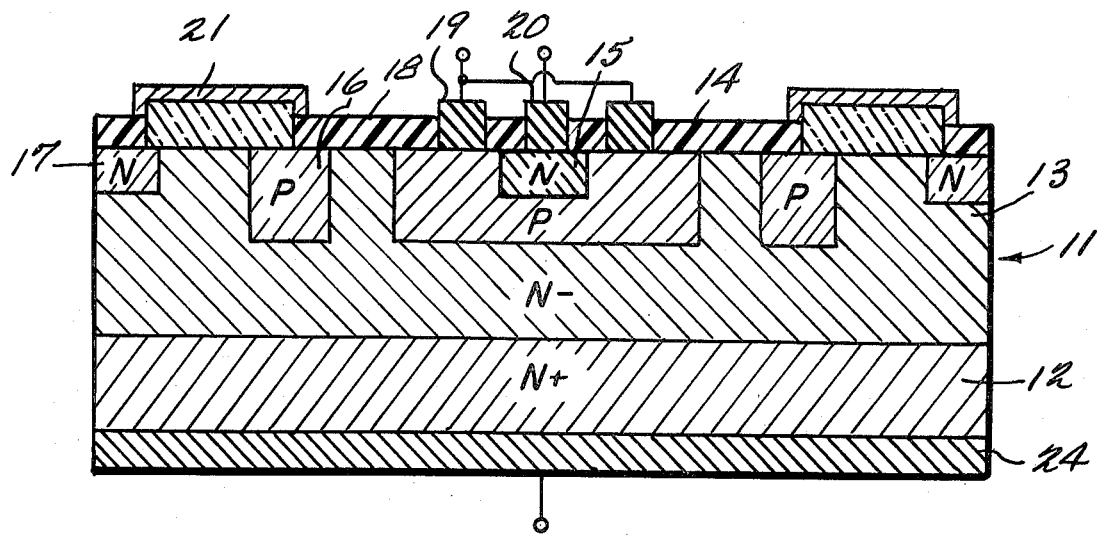
FIG. 1 is a cross-sectional plan view of an embodiment of this invention.

A planar type transistor having a high operating voltage is shown in FIG. 1. The substrate 11 is made up of highly doped N+ region 12 and the low doped N− epitaxial layer 13. Substrate 11 functions as a collector region. A base region 14 of P-type conductivity is formed on the surface of substrate 11 to expose an end of the collector-base junction. An emitter region 15 of N-type conductivity is formed on the surface of base region 14 to expose an end of the base-emitter junction. Base region 14 and emitter region 15 are formed by a conventional selective diffusing process. A guard ring region 16 of P-type conductivity is formed on the surface of substrate 11 surrounding base region 14 in the same step forming base region 14. Guard ring region 16 is positioned to be able to spread a depletion layer (not shown) upon applying a reverse bias voltage to the p-n junction between layer 13 and base region 14. Guard ring region 16 thus functions to increase the operating voltage of the transistor. Channel stopper ring region 17 of N-type conductivity is formed on the surface of substrate 11 surrounding guard ring region 16 in the same step forming emitter region 15.

A silicon oxide film 18 covers the surface of epitaxial layer 13, having several windows which are opened on the surfaces of base region 14, emitter region 15, and between guard ring region 16 and channel stopper ring region 17 respectively. Base electrode 19 and emitter electrode 20 are formed in the windows of oxide film 18. Glass film 21 is formed in the other window of oxide film 18. Glass film 21 is made of glass powder. At first, glass powder is filled in the window of oxide film 18 and is heated between 600° C. and 800° C. and melted. Glass film 21 is weak to acid which is used in an etching process so that its surface must be protected. Phosphorus silicate glass film 23 is inert to etching and covers the surface of glass film 21. Collector electrode 24 is formed on the surface of body 12.

According to the embodiment of FIG. 1 glass layer 21 is positioned outside guard ring region 16, and oxide film 18 covers another surface of substrate 11 so that the width of glass film 21 is smaller than the well known transistor, and the likelihood of damage to the glass film 21 is reduced.

Figure 2:
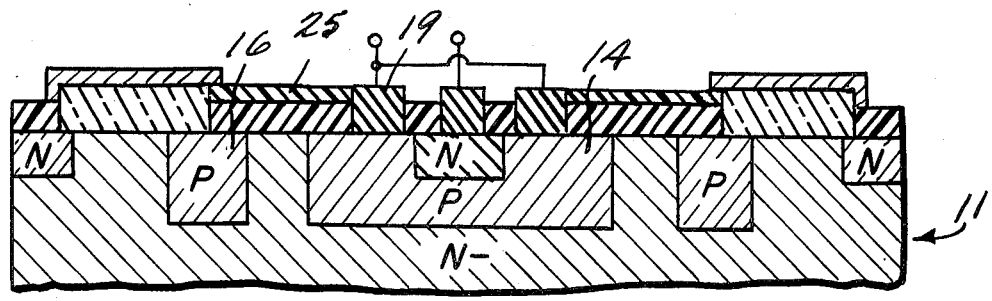
FIG. 2 is a partial cross-sectional plan view of another embodiment of this invention.
Figure 3:
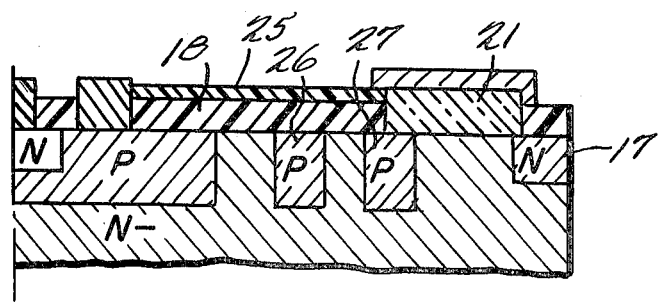
FIG. 3 is a partial cross-sectional plan view of a third embodiment of this invention.

FIGS. 2 and 3 illustrate other embodiments of this invention, and the same reference numbers in FIG. 1 designate corresponding parts. Referring to FIG. 2, there is shown an improved surface protecting structure in which oxide film 18 is protected by the glass passivation process. When the glass film is made of glass powder, the glass and the oxide film sometimes partially react and the oxide film takes plus and minus electric charge from the glass film. As a result of this reaction, the oxide film is of bad quality having unstable ions. Therefore, if a reverse bias voltages applied to the p-n junction between the base and the collector region, the depletion layer is distorted by the plus electric charge included into the oxide film. The depletion layer spreads to the boundary between the surface of the substrate and the oxide film and then into the collector region. The operating voltage then drops. In this embodiment, a protecting film 25 is formed on oxide film 18 which covers the surface of substrate 11 between base region 14 and guard ring region 16. Protecting film 25 must be inert during glassivation. Suitable materials for protecting film 25 are silicon nitride ($Si_3N_4$), polysilicon and alumina. Tungsten can also be used if it does not contact base electrode 19. The surface of oxide film 16 is thus protected during glass passivation. This protecting film not only covers the surface of the oxide film between base region 14 and guard ring 16 but may covers the surface of the oxide film formed as another portion.

Referring to FIG. 3, there is shown another embodiment according to this invention, having two guard ring regions 26 and 27 to increase operating voltage. Oxide film 18 and protecting film 25 thereon are formed between base region 14 and outer guard ring 27, and glass film 21 is formed between outer guard ring 27 and channel stopper ring region 17. The depletion layer can be extended by increasing the guard ring region. Therefore, the operating voltage increases.

Many additions and modifications to the above-described embodiments can, of course, be carried out without departing from the scope of the invention, that scope being intended to be limited only by the scope of the appended claims.

What is claimed is:

1. A semiconductor device comprising a substrate of first conductivity type, a main region of second conductivity type formed on said substrate, a guard ring region of second conductivity type formed surrounding said main region, an oxide film covering the surface of said susbtrate between said main region and said guard ring region, and a glass film directly covering only the outer periphery of the surface of said guardring and only the surface of said substrate adjacent and outside of said guard ring region.

2. A semiconductor device according to claim 1, further including a first protecting film covering said oxide film and non-reactive to glass passivation, and a second protecting film covering said glass film and non-reactive to etching.

3. A semiconductor device according to claim 1, wherein said guard ring region includes at least two regions.

4. A semiconductor device comprising a collector region of first conductivity type, a base region of second conductivity type formed on said collector region, an emitter region of first conductivity type formed on said base region, a guard ring region of second conductivity type formed on the collector region surrounding said base region, an oxide film covering the surface of said collector region between said base region and said guard ring region, a glass film covering only the outer periphery of the surface of said guard ring and only the surface of said collector region adjacent and outside of said guard ring region, a first protecting film covering said oxide film and non-reactive to glassivation, and a second protecting film covering said glass film and non-reactive to etching.

5. A semiconductor device comprising:
a semiconductor substrate of a first conductivity type,
a main region of a second conductivity type formed in the semiconductor substrate,
a first guard ring region of the second conductivity type formed in the semiconductor substrate surrounding said main region,
a second guard ring region of the second conductivity type located between the main region and the first guard ring region and formed in the semiconductor substrate surrounding said main region and concentric with the first guard ring region,
an oxide film covering the surface of the semiconductor substrate between said main region and said first guard ring region, and
a glass film directly covering only the outer periphery of said first guard ring and only the surface of the semiconductor substrate adjacent and outside of said first guard ring region.

6. A semiconductor device according to claim 3, further including a first protecting film non-reactive to glass passivation, and a second protecting film non-reactive to etching.

7. A semiconductor device comprising a semiconductor substrate defining a collector region of a first conductivity, a base region of a second conductivity type formed in the semiconductor substrate, an emitter region of the first conductivity type formed in the base region, a first guard ring region of the second conductivity type formed in the semiconductor substrate surrounding the base region, a second guard ring region of the second conductivity type located between the base region and the first guard ring region and formed in the semiconductor substrate surrounding said base region and concentric with the first guard ring region, an oxide film covering the surface of the semiconductor substrate between the base region and the first guard ring region, and a glass film directly covering only the outer periphery of the surface of said first guard ring and only the semiconductor substrate adjacent and outside of the first guard ring region.

8. A semiconductor device according to claim 3 further including a first protecting film non-reactive to glass passivation, and a second protecting film non-reactive to etching.

* * * * *